(12) United States Patent
Fukui

(10) Patent No.: US 6,523,943 B1
(45) Date of Patent: Feb. 25, 2003

(54) PIEZOELECTRIC ELEMENT, PROCESS FOR PRODUCING THE PIEZOELECTRIC ELEMENT, AND HEAD FOR INK-JET PRINTER USING THE PIEZOELECTRIC ELEMENT

(75) Inventor: Toshimi Fukui, Kyoto (JP)

(73) Assignee: Kansai Research Institute, Inc., Kyoto-Fu (JP)

( * ) Notice: Subject to any disclaimer, the term of this patent is extended or adjusted under 35 U.S.C. 154(b) by 0 days.

(21) Appl. No.: 09/702,719

(22) Filed: Nov. 1, 2000

(30) Foreign Application Priority Data

Nov. 1, 1999 (JP) .............................. 11-310991

(51) Int. Cl.$^7$ ................................................ B41J 2/45
(52) U.S. Cl. ....................................................... 347/68
(58) Field of Search .............................. 347/68, 69, 71, 347/72

(56) References Cited

FOREIGN PATENT DOCUMENTS

| EP | 0698490 A | * | 5/1997 | ............ B41J/2/045 |
|----|-----------|---|--------|------------------------|
| JP | 9-92897   |   | 4/1997 |                        |
| JP | 10-139594 |   | 5/1998 |                        |
| JP | 10-290035 |   | 10/1998 |                       |
| JP | 2000-208828 |  | 7/2000 |                       |

* cited by examiner

Primary Examiner—Anh T. N. Vo
(74) Attorney, Agent, or Firm—McDermott, Will & Emery

(57) ABSTRACT

A piezoelectric element capable of improving piezoelectric characteristics of a piezoelectric film is provided, and performance and durability of an ink-jet printer head are improved. A piezoelectric film 7 sandwiched between a lower electrode 6 and an upper electrode 8 is formed of PZT expressed by a chemical formula, $Pb(Zr_{1-x}Ti_x)O_3$ ($0.3 \leq x \leq 0.9$) or formed of a material mainly composed of PZT, and concentration ratio of titanium to zirconium in the piezoelectric film is gradually increased or gradually decreased from upper electrode side to lower electrode side.

16 Claims, 5 Drawing Sheets

PIEZOELECTRIC ELEMENT, PROCESS FOR PRODUCING THE PIEZOELECTRIC ELEMENT, AND HEAD FOR INK-JET PRINTER USING THE PIEZOELECTRIC ELEMENT

BACKGROUND OF THE INVENTION

1. Field of the Invention

The present invention relates to a piezoelectric element, which is used, for example, as an actuator for changing capacity of ink chamber in order to jet ink filled in the ink chamber from an ink nozzle through an ink passage in an ink-jet printer head, a process for producing the piezoelectric element, and an ink-jet printer head which is constructed using the piezoelectric element.

2. Prior Art

An ink-jet printer head is generally composed of a head base, a diaphragm, and an actuator. A part of the head is enlargedly and schematically shown in FIG. 7. A head base 11 is provided with a large number of ink nozzles for jetting ink, a large number of ink passages separately communicating to the respective ink nozzles, and a large number of ink chambers 12 separately communicating to the respective ink passages. (FIG. 7 shows only one of the ink chambers 12, and illustration of the ink passages and the ink nozzles is omitted.) A diaphragm 13 is mounted so as to cover the whole upper face of the head base 11, and the diaphragm 13 closes upper face openings of all the ink chambers 12 of the head base 11. On the diaphragm 13, piezoelectric elements 15 for giving a vibration driving force to the diaphragm 13 are mounted and formed on positions separately corresponding to the respective ink chambers 12. A power source 19 of an actuator 14 provided with a large number of piezoelectric elements 15 is controlled and voltage is applied to a desired and selected piezoelectric element 15, whereby the piezoelectric element 15 is displaced and the part of the diaphragm 13 is vibrated. As a result, capacity of an ink chamber 12 located at the part corresponding to the vibration of the diaphragm 13 is changed, and ink is pushed out from the ink nozzle through the ink passage.

Each of the piezoelectric elements 15 is constructed by forming a piezoelectric film 17 on a surface of a lower electrode 16, and forming an upper electrode 18 on a surface of the piezoelectric film 17 so as to sandwich the piezoelectric film 17 between the lower electrode 16 and the upper electrode 18. The piezoelectric film 17 is generally made of lead titanate zirconate ($Pb(Zr, Ti)O_3$; PZT) or made of a material mainly composed of the composite oxide. The piezoelectric film 17 having such composition is formed by sputtering method, vacuum deposition method, CVD method, laser ablation method, sol-gel method, thick film method (a method using piezoelectric paste), and so on.

For example, the Japanese Patent Publication (unexamined) No. 92897/1997, the Japanese Patent Publication (unexamined) No. 139594/1998, and the Japanese Patent Publication (unexamined) No. 290035/1998 disclose a process for forming a piezoelectric film of a piezoelectric element used in an ink-jet printer head utilizing sol-gel method by applying sol, which contains a piezoelectric material, over and over onto a lower electrode and repeating a heating process.

The Japanese Patent Publication (unexamined) No. 92897/1997 describes the piezoelectric element in which the lower electrode and the piezoelectric film are tightly fitted by arranging such that at least one of A and B may show a maximum value in concentration at the interface between the piezoelectric film having composition of $PbZrO_3/PbTiO_3/Pb(A_xB_y)O_3$ (x+y=1; A:Mg and so on, B:Nb and so on) and the lower electrode. The Japanese Patent Publication (unexamined) No. 139594/1998 describes an art of forming the piezoelectric film from a basic layer made of a ternary system piezoelectric member of lead-magnesium-niobate (PMN), lead zirconate and lead titanate, and a partial layer made of a binary system piezoelectric member of lead zirconate and lead titanate which is crystallized at a lower temperature as compared with the basic layer in order to prevent decrease in piezoelectric strain constant value even when the film is thick. The Japanese Patent Publication (unexamined) No. 290035/1998 describes a piezoelectric element in which a lower layer PZT film is formed on the lower electrode using sol-gel method, and thereafter, the lower layer PZT film is pre-annealed, the lower layer PZT film is crystallized so that titanium and lead may be crystallized faster than zirconium from the lower electrode side and that zirconium may easily segregate on the film surface, an upper layer PZT film is formed on the lower layer PZT film using sol-gel method, the PZT films are annealed, the upper layer PZT film is crystallized so that titanium and lead may be crystallized faster than zirconium from the lower layer PZT film side and that zirconium may easily segregate on the film surface, whereby, concentration of contained zirconium is lower on the lower electrode side and higher on the upper electrode side and concentration of contained titanium is higher on the lower electrode side and lower on the upper electrode side in each of the lower layer PZT film and the upper layer PZT film, and the dielectric constant of the piezoelectric film is lowered keeping the piezoelectric strain constant of the piezoelectric film in order to decrease capacitance and lower calorific value.

As disclosed in the Japanese Patent Publication (unexamined) No. 92897/1997, the Japanese Patent Publication (unexamined) No. 139594/1998, and the Japanese Patent Publication (unexamined) No. 290035/1998 respectively, many attempts have been proposed for improving characteristics and reliability in operation of the piezoelectric element used as an actuator in order to improve performance and durability of the ink-jet printer head. However, in the conventional piezoelectric element, composition of the piezoelectric film is uniform through the entire film. It is certain that the Japanese Patent Publication (unexamined) No. 290035/1998 discloses changing concentration of zirconium and titanium, which are contained in the piezoelectric film formed from PZT, in the thickness direction of the film. But, the piezoelectric element described in the Japanese Patent Publication (unexamined) No. 290035/1998 is merely arranged so that zirconium and titanium contained in the piezoelectric film may be distributed with concentration gradient (difference in concentration) in the thickness direction of the film in order that the dielectric constant of the piezoelectric film may be lowered, capacitance may be decreased, and calorific value may be lowered keeping the piezoelectric strain constant of the piezoelectric film. This known piezoelectric element is not arranged to improve piezoelectric characteristic thereof.

SUMMARY OF THE INVENTION

The present invention was made to resolve the above-discussed problems and has an object of providing a piezoelectric element capable of improving piezoelectric characteristics of a piezoelectric film, providing a process for suitably producing such a piezoelectric element, and providing an ink-jet printer head in which the piezoelectric element is used as an actuator.

An invention according to claim 1 provides a piezoelectric element in which an upper electrode and a lower electrode are arranged on two sides of a piezoelectric film formed of a composite oxide (PZT) expressed by a chemical formula, $Pb(Zr_{1-x}Ti_x)O_3$ ($0.3 \leq x \leq 0.9$) or formed of a material mainly composed of the composite oxide so as to sandwich the piezoelectric film therebetween, wherein concentration ratio of titanium to zirconium in the piezoelectric film is gradually increased or gradually decreased from the upper electrode side to the lower electrode side.

The foregoing expression, "concentration ratio of titanium to zirconium in the piezoelectric film is gradually increased or gradually decreased from the upper electrode side to the lower electrode side" includes not only a case in which the concentration ratio changes as indicated by the solid line I or broken line II in FIG. 2 and a case in which the concentration ratio changes stepwise as indicated by the solid line III or broken line IV in FIG. 3, but also a case in which the concentration ratio shows a change like a combination of the stepwise change and the linear change as indicated by the solid line V or broken line VI in FIG. 4. In this manner, the concentration ratio is gradually increased or gradually decreased from the upper electrode side to the lower electrode side, and this is confirmed by conducting, for example, a line analysis using x-ray microanalysis (EPMA). The concept of "concentration ratio is gradually increased or gradually decreased" in the invention also includes a case in which analysis data include minute unevenness caused by noise in elementary analysis, as long as the concentration ratio is gradually increased or gradually decreased from the upper electrode side to the lower electrode side of the piezoelectric film from a macroscopic viewpoint.

An invention according to claim 2 provides the piezoelectric element according to claim 1, wherein a face of the piezoelectric film, the face being in contact with the upper electrode, is formed of PZT expressed by a chemical formula, $Pb(Zr_{1-x}Ti_x)O_3$ ($0.45 \leq x \leq 0.50$) or formed of a material mainly composed of the composite oxide, and concentration ratio of titanium to zirconium is gradually increased or gradually decreased toward the lower electrode side.

An invention according to claim 3 provides the piezoelectric element according to claim 1, wherein a face of the piezoelectric film, the face being in contact with the lower electrode, is formed of PZT expressed by a chemical formula, $Pb(Zr_{1-x}Ti_x)O_3$ ($0.45 \leq x \leq 0.50$) or formed of a material mainly composed of the composite oxide, and concentration ratio of titanium to zirconium is gradually increased or gradually decreased toward the upper electrode side.

An invention according to claim 4 provides the piezoelectric element according to any of claims 1 to 3, wherein the piezoelectric film is 1 μm to 25 μm in thickness.

An invention according to claim 5 provides the piezoelectric element according to claim 4, wherein the piezoelectric film is 2 μm to 12 μm in thickness.

An invention according to claim 6 provides the piezoelectric element according to any of claims 1 to 5, wherein the piezoelectric film is made of plural layers of PZT thin films which are different in concentration ratio of titanium to zirconium. The foregoing expression, "PZT thin films of plural layers which are different in concentration ratio of titanium to zirconium" means that PZT thin films, which are different in concentration ratio, are formed into layers. It is also preferable that a PZT thin film having a concentration ratio is formed of plural layers having the same concentration ratio. The fact that the piezoelectric film is formed of the PZT thin films which are different in concentration ratio and are formed into layers, can be verified from stepwise change of the concentration ratio in the thickness direction as shown in FIG. 3 and FIG. 4 in elementary analysis of the piezoelectric film.

However, note that even when the piezoelectric film is formed of plural PZT thin films, the interfaces between the respective layers are not always clear. This is because a mass transfer takes place due to thermal diffusion in a burning process for forming the piezoelectric film. The change in concentration ratio in the piezoelectric film actually becomes something like a combination of stepwise change and linear change as shown in FIG. 4 in some cases.

An invention according to claim 7 provides the piezoelectric element according to claim 6, wherein the piezoelectric film is made of PZT thin films of not less than three layers which are different in concentration ratio of titanium to zirconium.

An invention according to claim 8 provides the piezoelectric element according to claim 7, wherein the piezoelectric film is made of PZT thin films of not less than four layers which are different in concentration ratio of titanium to zirconium.

An invention according to claim 9 provides a process for producing a piezoelectric element comprising the steps of forming a lower electrode on a substrate, forming a piezoelectric film, which is composed of PZT expressed by a chemical formula, $Pb(Zr_{1-x}Ti_x)O_3$ ($0.3 \leq x \leq 0.9$) or formed of a material mainly composed of the composite oxide, on the lower electrode, and forming an upper electrode on the piezoelectric film, wherein the piezoelectric film is formed by using plural types of compositions which respectively contain PZT and/or a precursor of PZT and are different in concentration ratio of titanium to zirconium and laminating the compositions on the lower electrode in order of concentration ratio of titanium to zirconium that gradually increases or gradually decreases.

An invention according to claim 10 provides the process for producing a piezoelectric element according to claim 9, wherein not less than three types of compositions which are different in concentration ratio of titanium to zirconium are used.

An invention according to claim 11 provides the process for producing a piezoelectric element according to claim 10, wherein not less than four types of compositions which are different in concentration ratio of titanium to zirconium are used.

An invention according to claim 12 provides the process for producing a piezoelectric element according to any of claims 9 to 11, wherein the compositions are pastes.

An invention according to claim 13 provides the process for producing a piezoelectric element according to any of claims 9 to 11, wherein the compositions are solutions.

An invention according to claim 14 provides the process for producing a piezoelectric element according to claim 13, wherein the solutions are prepared using metallic alkoxide and/or metallic salt as starting material.

An invention according to claim 15 provides a process for producing a piezoelectric element comprising the steps of forming a lower electrode on a substrate, forming a piezoelectric film, which is composed of PZT expressed by a chemical formula, $Pb(Zr_{1-x}Ti_x)O_3$ ($0.3 \leq x \leq 0.9$) or formed of a material mainly composed of the composite oxide, on the lower electrode, and forming an upper electrode on the piezoelectric film, wherein the piezoelectric film is formed on the lower electrode by vacuum method such as sputtering method, vacuum deposition method, CVD method, and laser ablation method so that concentration ratio of titanium to zirconium in the piezoelectric film may gradually increase or gradually decrease from the upper electrode side to the lower electrode side.

An invention according to claim 16 provides an ink-jet printer head in which one or not less than two ink nozzles are provided, capacity of an ink chamber communicating to the ink nozzle is changed by an actuator, and ink is jetted through the ink nozzle, wherein the piezoelectric element according to any of claims 1 to or 8 is used as the actuator.

In the piezoelectric element according to claim 1, concentration ratio of titanium to zirconium in the piezoelectric film is gradually increased or gradually decreased from the upper electrode side to the lower electrode side, and this improves piezoelectric characteristic of the piezoelectric film such as diminishing occurrence of stress on the interface between the lower electrode and the piezoelectric film or improving leakage characteristic (conditions in association with the change in leakage current amount when applying a voltage to the piezoelectric film). It is also possible to achieve a larger displacement as compared with a conventional element.

The piezoelectric element according to claim 2 has composition in which the face side of the piezoelectric film, which face is in contact with the upper electrode, has the largest piezoelectric (strain) constant of PZT in the vicinity of a morphotropic phase transition boundary, and the piezoelectric film contracts more on the upper electrode side. On the other hand, the piezoelectric film has a smaller piezoelectric constant on the lower electrode side, and occurrence of stress on the interface between the lower electrode and the piezoelectric film is diminished. It is especially possible to achieve an improvement in displacement.

In the piezoelectric element according to claim 3, the composition on the face side of the piezoelectric film, the face being in contact with the lower electrode, is deviated from the composition in which the piezoelectric constant of PZT becomes the largest in the vicinity of the morphotropic phase transition boundary, and this improves leakage characteristic.

In the piezoelectric element according to claim 4, the piezoelectric film is 1 $\mu$m to 25 $\mu$m in thickness. As a result, there is no more such disadvantage that effective vibration is not achieved by the element due to excessively thin piezoelectric film and does not have sufficient driving force or that a large driving voltage is required for displacement of the element due to excessively thick piezoelectric film.

In the piezoelectric element according to claim 5, the driving force is appropriate and effective vibration is obtained, and displacement of the element does not require any large driving voltage.

In the piezoelectric element according to claim 6, the piezoelectric film is made of PZT thin films of plural layers. As a result, it is possible to relax stress occurring between the respective layers and prevent deterioration of the element.

In the piezoelectric element according to claim 7, the piezoelectric film is made of PZT thin films of not less than three layers. As a result, it is possible to relax stress occurring between the respective layers and prevent deterioration of the element.

In the piezoelectric element according to claim 8, the piezoelectric film is made of PZT thin films of not less than four layers. As a result, it is possible to relax stress occurring between the respective layers and prevent deterioration of the element more effectively.

In the process for producing the piezoelectric element according to claims 9 to 15, the piezoelectric element according to claim 1 is obtained through a relatively simple process.

The ink-jet printer head according to claim 16 is provided with the piezoelectric element having the foregoing characteristics according to claims 1 to 8 as the actuator. As a result, it is possible to obtain improvement in efficiency as well as in durability.

DESCRIPTION OF THE PREFERRED EMBODIMENTS

A preferred embodiment of the present invention is hereinafter described with reference to FIG. 1.

Figure 1:
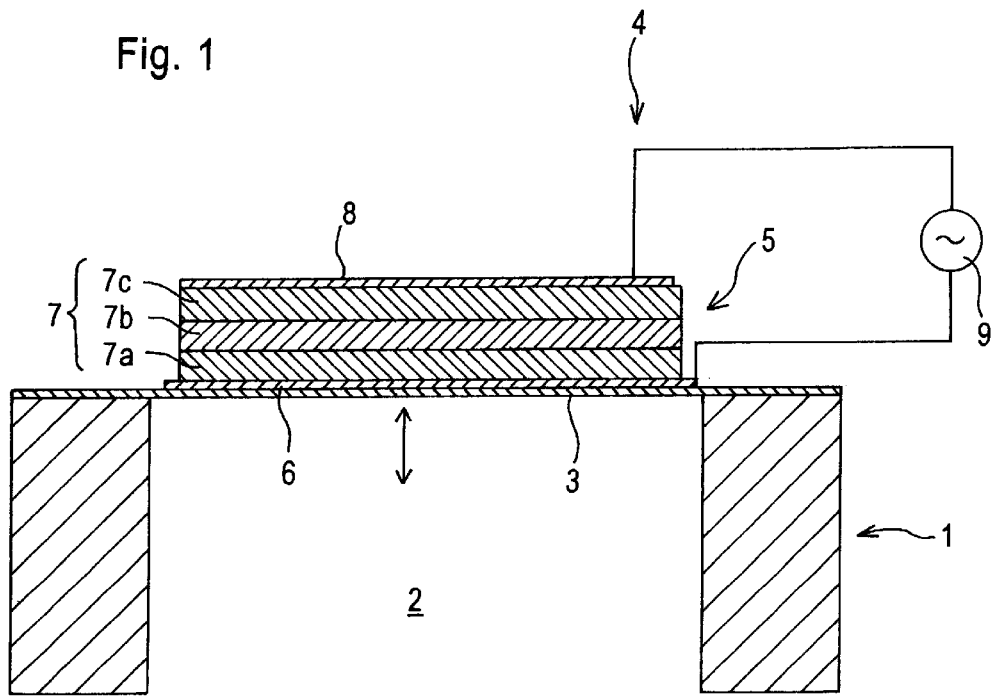
FIG. 1 is a vertical sectional view showing an example of the invention, and in which a part of an ink-jet printer head of which a piezoelectric element is used as an actuator is enlargedly and schematically shown.

FIG. 1 is a vertical sectional view showing an example of the invention, and in which a part of an ink-jet printer head of which a piezoelectric element is used as an actuator is enlargedly and schematically shown. The fundamental construction of the printer head is the same as that of the conventional printer head such that the printer head is composed of a head base 1, a diaphragm 3, and an actuator 4. The head base 1 is provided with a large number of ink nozzles (not shown in the drawing) for jetting ink, a large number of ink passages (not shown in the drawing) separately communicating to the respective ink nozzles, and a large number of ink chambers 2 separately communicating to the respective ink passages. The diaphragm 3 is mounted so as to cover the whole upper face of the head base 1, and the diaphragm 3 closes upper face openings of all the ink chambers 2 of the head base 1. On the diaphragm 3, piezoelectric elements 5 for giving vibration driving force to the diaphragm 3 are mounted and formed on positions separately corresponding to the respective ink chambers 2. A power source 9 of the actuator 4 provided with the a large number of piezoelectric elements 5 is controlled, and voltage is applied to a desired and selected piezoelectric element 5, whereby the piezoelectric element 5 is displaced and the part of the diaphragm 3 is vibrated. As a result, capacity of an ink chamber 2 located at the part corresponding to the vibration of the diaphragm 3 is changed, and ink is pushed out from the ink nozzle through the ink passage and printing is conducted.

Each of the piezoelectric elements 5 is constructed by forming a piezoelectric film 7 on the surface of a lower electrode 6 and forming an upper electrode 8 on the surface of the piezoelectric film 7 so as to sandwich the piezoelectric film 7 between the lower electrode 6 and the upper electrode 8. The material of the lower electrode 6 is not particularly limited as long as the material is normally used in the piezoelectric element. For example, platinum (Pt) and aurum (Au) are used as the material. The material of the upper electrode 8 is not particularly limited, either, as long as the material is normally used in the piezoelectric element. For example, Au, Pt, and so on are used as the material. These electrodes 6, 8 are, for example, approximately 0.05 μm to 2 μm in thickness, however, the thickness thereof is not limited in particular. It is also preferable to arrange a close contact layer, which is made of, for example, Ti, between the lower electrode 6 and the piezoelectric film 7 and/or between the piezoelectric film 7 and the upper electrode 8.

The piezoelectric film 7 is made of PZT expressed by a chemical formula, $Pb(Zr_{1-x}Ti_x)O_3$ ($0.3 \leq x \leq 0.9$, preferably $0.4 \leq x \leq 0.9$) or made of a material mainly composed of the composite oxide. The piezoelectric film 7 having composition of x<0.3 is not practical because the piezoelectric constant is too small. On the other hand, the piezoelectric film 7 having composition of x>0.9 is not practical because degree of sintering of PZT is decreased, and a high heat treatment temperature is required in forming a PZT thin film in the process of producing the piezoelectric film 7, while minuteness or compactness of the PZT thin film is not developed by heat treatment under normal burning conditions and the piezoelectric constant is decreased. Note that the condition in which the range of x is not less than least 0.3 and not more than 0.9 described in the invention does not mean the average composition of the whole piezoelectric film, but means that when the piezoelectric film has a single-layer structure, the single layer satisfies the foregoing condition in any portion, and means that when the piezoelectric film has a multiple layer structure, each of the multiple layers satisfies the foregoing condition in any portion.

The piezoelectric film 7 is approximately 1 μm to 25 μm in thickness. Note that intensity of the driving force of the piezoelectric film 7 is influenced by bulk of the piezoelectric element. When the piezoelectric film 7 is too thin, the driving force is not sufficient to obtain an effective vibration to serve as the piezoelectric element 5, and when the piezoelectric film 7 is too thick, large voltage is required in order to displace the piezoelectric element 5. However, when the piezoelectric film 7 is approximately is in the range of 1 μm to 25 μm in thickness, preferably 2 μm to 12 μm in thickness, an effective vibration to serve as the piezoelectric element 5 is obtained and the piezoelectric element 5 is displaced without requiring any large voltage.

The piezoelectric film 7 is made of PZT thin films of plural layers, preferably three to ten layers of different composition, that is, PZT thin films which are different in concentration ratio of titanium to zirconium. When the piezoelectric film 7 is made of PZT thin films of preferably three to ten layers, more preferably four to eight layers, which are different in composition, difference in piezoelectric constant value between neighboring PZT thin films is decreased and stress which occurs between the respective layers is relaxed. On the other hand, it is not preferable to excessively increase number of the layers because the producing process of the element becomes complex. In the illustrated example, the piezoelectric film 7 is formed of PZT thin films 7a, 7b, 7c which are three layers of a lower layer, an intermediate layer, and an upper layer. The PZT thin films 7a, 7b, 7c are arranged so that concentration ratio of titanium to zirconium in PZT in the direction of thickness of the piezoelectric film 7 may be gradually increased or gradually decreased.

In a concrete example of constitution of the piezoelectric film 7, the PZT thin film 7c on the upper electrode 8 side is formed of PZT expressed by a chemical formula, $Pb(Zr_{1-x}Ti_x)O_3$ ($0.45 \leq x \leq 0.50$) or formed of a material mainly composed of the composite oxide so that concentration ratio of titanium to zirconium in the respective PZT thin films 7c, 7b, 7a may be gradually increased or gradually decreased toward the lower electrode 6 side. The piezoelectric film 7 of such constitution has a composition in which the PZT thin film 7c on the upper electrode 8 side has the largest piezoelectric constant of PZT in the vicinity of the morphotropic phase transition boundary. Consequently, the piezoelectric film 7 contracts more on the upper electrode 8 side, and the piezoelectric element 5 performs its function sufficiently. On the other hand, in the piezoelectric film 7, the PZT thin film 7a on the lower electrode 6 side has a smaller piezoelectric constant, and occurrence of stress on the interface between the lower electrode 6 and the piezoelectric film 7 is diminished. As a result, when the piezoelectric element 5 is used for a long time, the element in the vicinity of the interface between the lower electrode 6 and the piezoelectric film 7 is prevented from deterioration, and it is possible to stably use the piezoelectric element 5 for a long time.

In another example of the piezoelectric film 7, the PZT thin film 7a on the lower electrode 6 side is formed of PZT expressed by a chemical formula, $Pb(Zr_{1-x}Ti_x)O_3$ ($0.45 \leq x \leq 0.50$) or formed of a material mainly composed of the composite oxide so that concentration ratio of titanium to zirconium in the respective PZT thin films 7a, 7b, 7c may be gradually increased or gradually decreased toward the upper electrode 8 side. In the piezoelectric film 7 of such constitution, composition of the PZT thin film 7 con the upper electrode 8 side in the piezoelectric film 7 is deviated from the composition in which the piezoelectric constant of PZT is largest in the vicinity of the morphotropic phase transition boundary, and this improves leakage characteristic. More specifically, the piezoelectric film 7 is originally an insulating substance in itself, and it is therefore preferable not to flow electricity. However, actually a very small amount of electric current flows due to a grain boundary, deviation of the composition, and so on. It is not possible to effectively apply an electric field to the piezoelectric film 7 when any electric current flows in the piezoelectric film 7, and it is necessary to decrease the leakage current as much as possible. However, in the PZT having composition of $0.45 \leq x \leq 0.50$ in the mentioned chemical formula, crystal structure is unstable (the crystal structure is transformed from a tetragonal system to a rhombohedral system), and it is presumed that defective structure and deviation of composition, which may generate the leakage current, are liable to occur. To cope with this, it is possible that the leakage characteristic is improved by shifting the composition of the PZT thin film 7c on the upper electrode 8 side to an region of excess titanium or zirconium in which the crystal structure of PZT is stable. In order to make the PZT thin film 7c on the upper electrode 8 side into a leakage preventing layer, it is preferable to shift appropriately the composition from $0.45 \leq x \leq 0.50$ in the mentioned chemical formula. In this manner, the leakage characteristic in the piezoelectric film 7 is improved, and as a result, it is possible to stably use the piezoelectric element 5 for a long time.

The piezoelectric film 7 of the foregoing composition is formed by using a method of applying piezoelectric paste, sol-gel method, sputtering method, vacuum deposition method, CVD method, laser ablation method, and so on. In the method of applying piezoelectric paste or sol-gel method, a composition containing PZT and/or a precursor of PZT is used, and these compositions are applied onto the lower electrode over and over to form a piezoelectric film. The composition containing PZT and/or a precursor of PZT is, specifically, PZT powder, PZT precursor powder (for example, a mixture of $(Zr_{1-x}Ti_x)_2O_4$ powder and PbO powder), a mixture of PZT precursor powder and a solution (for example, a mixture of PbO powder and a solution containing each alkoxide of Zr and Ti or a material produced by hydrolyzing and polymerizing them), a solution of PZT precursor (each alkoxide of Zr, Ti, and Pb or metallic salt or a material produced by hydrolyzing and polymerizing them), a mixture of PZT powder and PZT precursor powder, a mixture of PZT powder, PZT precursor powder, and a solution of PZT precursor, or a mixture of PZT powder and a solution of PZT precursor. Examples of the method of applying piezoelectric paste and sol-gel method are hereinafter described in more detail.

In the method of forming the piezoelectric film 7 by using paste, first, three to ten, preferably, four to eight types of pastes containing PZT and/or a precursor of PZT and are different in concentration ratio of titanium to zirconium are prepared. These pastes are prepared by adding PZT powder and organic binder each of applicable composition to solvent. The PZT powder of applicable composition is produced by a publicly-known method such as solid phase reaction of the raw material powder, sol-gel method using metallic alkoxide or metallic salt as a starting material, coprecipitation method, hydrothermal method, and spray decomposition method. The material used as the organic binder is, for example, hydroxyethylcellulose, hydroxypropylcellulose, polyvinyl alcohol, nylon, and a homopolymer or a copolymer of (meth)acrylic acid. The solvent is used in order to improve workability in applying the paste, and is suitably selected from various types of solvents. For example, ethylcellulosolve is used as such a solvent. PZT is superior in dispersibility even when it is blended in high concentration in the paste.

Thus, plural types of pasts containing PZT or a precursor of PZT are obtained, and these pastes are then applied onto the lower electrode formed on a substrate of zirconia or the like by thick film method (a method using a conductive paste), sputtering method, deposition method, or the like in order of titanium to zirconium that gradually increases or gradually decreases, and the solvent is removed by drying each time a paste is applied if necessary, and the pastes are applied over and over up to form multiple layers. The method for applying the pastes includes, for example, a common coating method such as screen printing method, spin coating method, dipping method, casting method, and doctor blade method, and is not particularly limited. After completing a series of paste applying process, burning is conducted. The burning is conducted at an appropriate temperature of, for example, 300° C. to 1,400° C., and preferably 600° C. to 1,200° C. The burning is conducted under any atmosphere such as inert-gas atmosphere, oxygen-contained atmosphere (in the air or the like), and PbO atmosphere, and it is possible to conduct the burning under normal pressure or reduced pressure. The burning is normally conducted by raising the temperature from room temperature to approximately 300° C. to 1,400° C. taking a few minutes to 24 hours in the air. It is also preferable to raise the temperature stepwise. Almost all of the organic components disappear or dissipate due to the burning as described above, and the piezoelectric film of minute and compact structure is obtained. After forming the piezoelectric film on the lower electrode, the upper electrode is formed on the piezoelectric film by normal method such as thick film method (a method using conductive paste), sputtering method, or deposition method, and thus a piezoelectric element is obtained.

Then, in the method of forming the piezoelectric film 7 using sol-gel method, first, preferably three to ten, more preferably four to eight, types of solutions containing PZT and/or a precursor of PZT and different in concentration ratio of titanium to zirconium are prepared. These solutions are prepared by using, for example, each alkoxide of lead, titanium, and zirconium and/or salt as starting materials and hydrolyzing and polymerizing a solution containing these raw materials. The metallic alkoxide is not particularly limited, and for example, it is preferable to use alkoxyl in which number of carbon is 1 to 15, and it is more preferable to use alkoxyl in which number of carbon is 1 to 4. Acetate, oxalate, nitrate, chloride, and so on are used as the metallic salt.

Single solvent or mixed solvent can be used as the solvent for dissolving metallic alkoxide and/or metallic salt, provided that the starting material and water used in hydrolyzation are soluble. The solvent is not particularly limited, and it is possible to use, for example, a combination of polar solvent and nonpolar solvent. Alcohol or amide is used in view of viscosity in the temperature range of adding water and easiness in removing the solvent. Nonpolar solvent such as toluene and hydrocarbon can be used jointly. For example, first-class alcohol such as methanol, ethanol, propanol, or butanol, second-class alcohol such as ethylene glycol or propylene alcohol, and alkoxy alcohol such as 2-methoxyethanol, 2-ethoxyethanol, 2-butoxyethanol, or 1-methoxy-2-propanol in which number of carbon is 1 to 5, are used as alcohol. Formamide, N,N-dimethylformamide (DMF), or the like is used as acid amide. Further, it is possible to use aromatic compound such as toluene, hydrocarbon such as hexane or cyclohexane, ester such as methyl acetate or ethyl acetate, and acetonitrile.

In order to improve stability of the solution, it is preferable to add, for example, alkanolamine such as monoethanolamine, diethanolamine or triethanolamine and β-diketone such as acetylacetone, methyl acetoacetate or ethylacetoacetate into the solution containing metallic alkoxide and/or metallic salt.

In hydrolyzing the solution containing metallic alkoxide and/or metallic salt, for example, 0.05 mole to 2 mole of water is added with respect to 1 mole of metallic alkoxide and/or metallic salt, and preferably 0.5 mole to 1.5 mole of water is added with respect to 1 mole of metallic alkoxide and/or metallic salt. It is also preferable to use an acid catalyst and/or a base catalyst in the hydrolyzation, and it is more preferable to use a mineral acid such as hydrochloric acid or an organic acid such as acetic acid.

After preparing the plural types of solutions containing PZT or a precursor of PZT by hydrolyzing the solution containing metallic alkoxide and/or metallic salt, these solutions are applied onto the surface of the lower electrode, then dried, and burnt. Thus, the piezoelectric film is formed on the lower electrode. In this process, the plural types of solutions containing PZT or a precursor of PZT are applied onto the lower electrode in order of concentration ratio of titanium to zirconium of titanium to zirconium that gradually increases or gradually decreases by repeating the respective steps of forming a film, drying, and preliminary (intermediate) burning. The burning is conducted at the final stage. Spin coating method is normally used as the method of applying the solutions, but the method is not particularly limited. The temperature of the preliminary (intermediate) burning is, for example, approximately 300° C. to 400° C., and the temperature of the burning conducted at the final stage is, for example, approximately 500° C. to 1000° C. It is also preferable to use solutions of the same concentration ratio of titanium to zirconium, by applying, drying, and preliminarily burning several times for each solution, thereby forming the respective PZT thin films. After forming the piezoelectric film on the lower electrode, the upper electrode is formed on the piezoelectric film by a normal method, and thus a piezoelectric element is obtained.

In the method of forming the piezoelectric film using the pastes and the method of forming the piezoelectric film using the solutions by sol-gel method described above, it is also possible to use any composition other than the mentioned pastes and solutions, provided that the composition contains PZT or a precursor of PZT and the piezoelectric film is formed by applying and laminating the composition onto the lower electrode.

Elementary analysis in the piezoelectric film is conducted by using x-ray microanalysis (EPMA) when the film is approximately 10 $\mu$m in thickness and using energy-dispersive x-ray microanalysis (EDX), x-ray optoelectronic spectral analysis (ESCA), secondary ion mass analysis (SIMS), and Auger analysis (AES) when the film is not more than several $\mu$m in thickness.

EXAMPLES

Described hereinafter are specific examples of the invention.
(Preparation of Piezoelectric Paste)

PZT powders of each composition were made by the steps of mixing $(Zr_{1-x}Ti_x)_2O_4$ powder (produced by Sakai Chemical Industry Co., Ltd.) and PbO powder (produced by Kohjundo Chemical) of applicable composition using methanol as a medium by means of a ball mill, burning the mixture at a temperature of 650° C., and grinding the obtained burnt material by means of a zirconia ball in methanol for 16 hours in the ball mill. The average particle size of the obtained PZT powder was 0.2 $\mu$m. In addition, PZT powder, in which $La_2O_3$ or $Nb_2O_5$ was added, was prepared by adding oxide material of $La_2O_3$ or $Nb_2O_5$ to $(Zr_{1-x}Ti_x)_2O_4$ powder (produced by Sakai Chemical Industry Co., Ltd.) and PbO powder (produced by KOJUNDO Chemical) and using the same method as described above.

Paste 1 to Paste 15 containing PZT of each composition or containing PZT as a main component were prepared by adding 100 weight parts of the obtained PZT powder and 9 weight parts of hydroxypropyl cellulose (produced by Nippon Soda Co., Ltd., HPC-L) to 8 weight parts of ethylcellosolve and kneading them using a three-roll mixer.

Paste 1: $Pb(Zr_{0.6}Ti_{0.4})O_3$
Paste 2: $Pb(Zr_{0.56}Ti_{0.44})O_3$
Paste 3: $Pb(Zr_{0.52}Ti_{0.48})O_3$
Paste 4: $Pb(Zr_{0.45}Ti_{0.55})O_3$
Paste 5: $Pb(Zr_{0.4}Ti_{0.6})O_3$
Paste 6: $Pb(Zr_{0.3}Ti_{0.7})O_3$
Paste 7: $Pb(Zr_{0.2}Ti_{0.8})O_3$
Paste 8: $0.02La_2O_3$-$0.98Pb(Zr_{0.52}Ti_{0.48})O_3$
Paste 9: $0.02La_2O_3$-$0.98Pb(Zr_{0.45}Ti_{0.55})O_3$
Paste 10: $0.02La_2O_3$-$0.98Pb(Zr_{0.4}Ti_{0.6})O_3$
Paste 11: $0.02Nb_2O_5$-$0.98Pb(Zr_{0.52}Ti_{0.48})O_3$
Paste 12: $0.02Nb_2O_5$-$0.98Pb(Zr_{0.45}Ti_{0.55})O_3$
Paste 13: $0.02Nb_2O_5$-$0.98Pb(Zr_{0.4}Ti_{0.6})O_3$
Paste 14: $Pb(Zr_{0.55}Ti_{0.45})O_3$
Paste 15: $Pb(Zr_{0.5}Ti_{0.5})O_3$ Examples 1 to 14

In order to prepare a piezoelectric element for an ink-jet printer head of a construction as shown in FIG. 1, Pt paste was screen printed on a zirconia substrate of 10 $\mu$m in thickness serving as a diaphragm, so as to be 5 $\mu$m in thickness serving as the lower electrode after burning, and then a multilayer film was prepared in which each kind of paste is screen printed so that the piezoelectric film may be 10 $\mu$m in whole thickness and 200 $\mu$m×3 mm in size. The layers in the multilayer film are respectively as follows:

Examples 1, 2, 5 to 8: 2 $\mu$m, 2 $\mu$m, 6 $\mu$m in thickness from the lower electrode side;

Example 3: 1 $\mu$m, 1.5 $\mu$m, 1.5 $\mu$m, 6 $\mu$m in thickness from the lower electrode side;

Example 4: 1 $\mu$m, 1 $\mu$m, 1 $\mu$m, 1 $\mu$m, 6 $\mu$m in thickness from the lower electrode side;

Examples 9, 10, 13, 14: 6 $\mu$m, 2 $\mu$m, 2 $\mu$m in thickness from the lower electrode side;

Example 11: 6 $\mu$m, 1.5 $\mu$m, 1.5 $\mu$m, 1 $\mu$m in thickness from the lower electrode side; and Example 12: 6 $\mu$m, 1 $\mu$m, 1 $\mu$m, 1 $\mu$m, 1 $\mu$m in thickness from the lower electrode side.

The obtained multilayer film was burnt at a predetermined temperature for 5 hours under PbO atmosphere, and the piezoelectric film was formed on the lower electrode. Face analysis was conducted on the surface of the upper electrode side of the obtained piezoelectric film by EDX, and the Ti/Zr ratio was confirmed. The piezoelectric film was exfoliated from the lower electrode face, and face analysis was conducted on the surface of the lower electrode side of the piezoelectric film by EDX, and the Ti/Zr ratio was confirmed. Line analysis was conducted from the upper electrode side to the lower electrode side by EPMA, and change in Ti/Zr ratio in the direction of thickness of the piezoelectric film was confirmed. Finally Au serving as the upper electrode was formed by sputtering method on the piezoelectric film, and thus a piezoelectric element was made.

Figure 3:
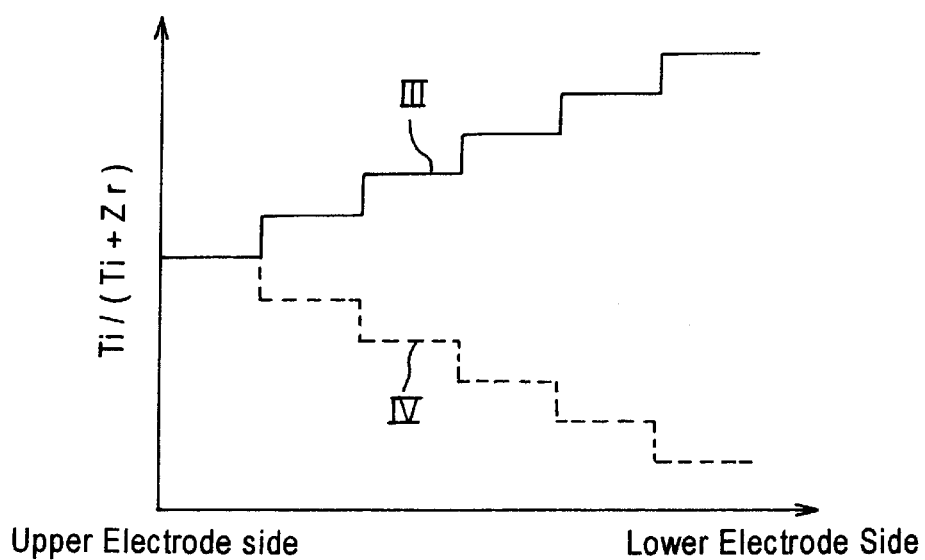
FIG. 3 is a diagram showing another Example.
Figure 4:
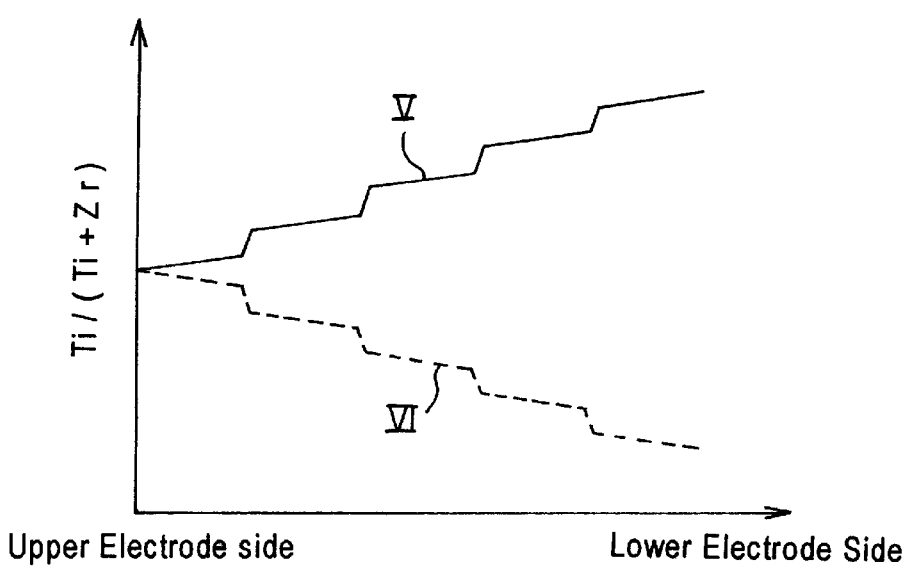
FIG. 4 is a diagram showing a further Example.
Figure 5:
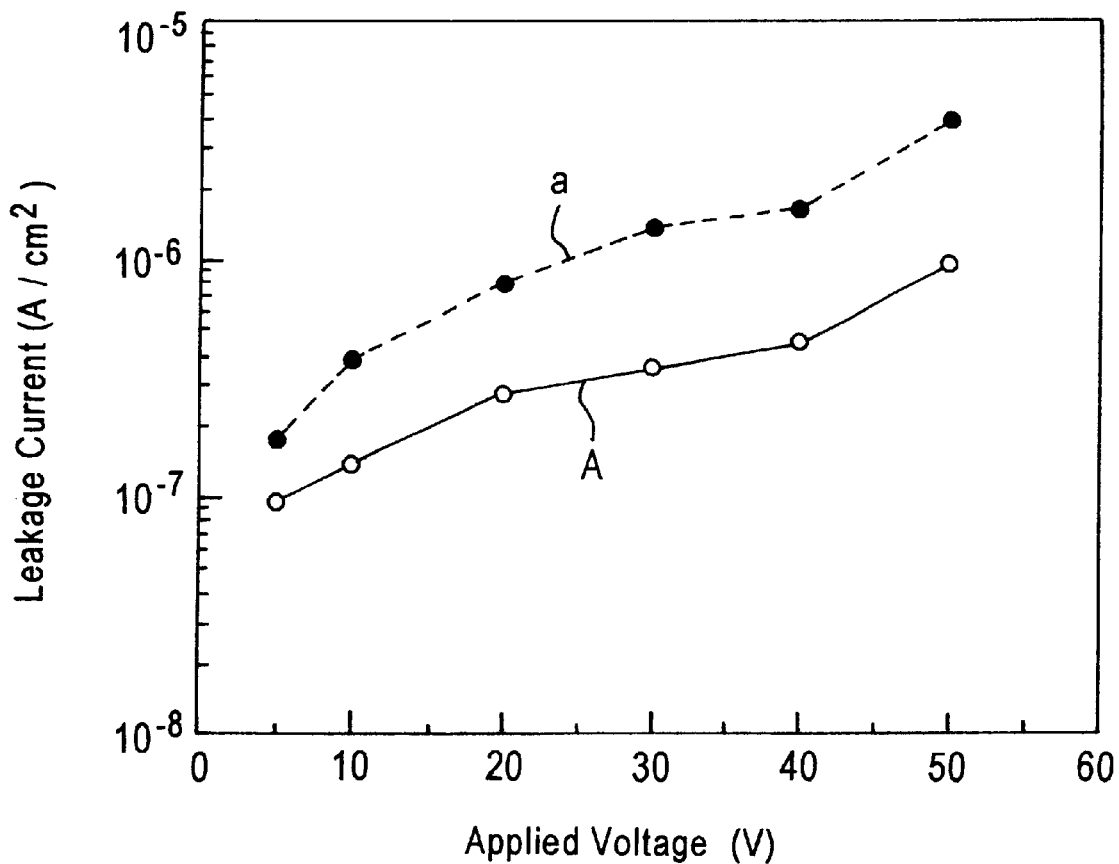
FIG. 5 is a diagram showing I–V characteristics of each of the piezoelectric elements obtained in Example 9 and each of the piezoelectric elements obtained in Comparative Example 3.

The obtained piezoelectric element was evaluated by measuring amplitude of the element at the time of applying an electric field of 30V using a Tencor measuring instrument. I–V characteristics were measured in order to evaluate leakage characteristic of the piezoelectric element at the time of applying an electric field of 30V. The paste composition, burning temperature, evaluation results, each Ti/Zr ratio on the lower electrode side and the upper electrode side, and type or manner of increase and decrease in Ti/Zr ratio (See FIG. 3) are collectively shown in Table 1. In Table 1 (as well as in Table 2 described later), the numerical values shown in the respective columns of "Ti/Zr Ratio on Lower Electrode Side" and "Ti/Zr Ratio on Upper Electrode Side" were obtained by averaging and generalizing the values obtained by actual measurement. I–V characteristics of the piezoelectric element obtained in Example 9 are indicated by the solid line A in FIG. 5.

TABLE 1

| | Paste Composition (From Lower Electrode Side) | | | | | Burning | | Leakage | Ti/Zr Ratio on Lower | Ti/Zr Ratio on Upper | Type of |
| --- | --- | --- | --- | --- | --- | --- | --- | --- | --- | --- | --- |
| | 1$^{st}$ Layer | 2$^{nd}$ Layer | 3$^{rd}$ Layer | 4$^{th}$ Layer | 5$^{th}$ Layer | Temperature (° C.) | Amplitude ($\mu$m) | Current (A/Cm$^2$) | Electrode Side | Electrode Side | Increase/ Decrease |
| Example 1 | 1 | 2 | 3 | | | 1050 | 0.29 | 7.1 ×10$^{-7}$ | 40/60 | 48/52 | IV |
| Example 2 | 5 | 4 | 3 | | | 1050 | 0.30 | 7.4 ×10$^{-7}$ | 60/40 | 48/52 | III |
| Example 3 | 6 | 5 | 4 | 3 | | 1050 | 0.31 | 7.2 ×10$^{-7}$ | 70/30 | 48/52 | III |
| Example 4 | 7 | 6 | 5 | 4 | 3 | 1050 | 0.30 | 7.5 ×10$^{-7}$ | 80/20 | 48/52 | III |
| Example 5 | 10 | 9 | 8 | | | 1070 | 0.30 | 6.1 ×10$^{-7}$ | 60/40 | 48/52 | III |
| Example 6 | 13 | 12 | 11 | | | 1070 | 0.32 | 6.8 ×10$^{-7}$ | 60/40 | 48/52 | III |
| Example 7 | 1 | 2 | 14 | | | 1050 | 0.29 | 6.9 ×10$^{-7}$ | 40/60 | 45/55 | IV |
| Example 8 | 1 | 2 | 15 | | | 1050 | 0.29 | 6.8 ×10$^{-7}$ | 40/60 | 50/50 | IV |
| Example 9 | 3 | 2 | 1 | | | 1050 | 0.23 | 3.5 ×10$^{-7}$ | 48/52 | 40/60 | III |
| Example 10 | 3 | 4 | 5 | | | 1050 | 0.22 | 4.1 ×10$^{-7}$ | 48/52 | 60/40 | IV |
| Example 11 | 3 | 4 | 5 | 6 | | 1050 | 0.22 | 3.6 ×10$^{-7}$ | 48/52 | 70/30 | IV |
| Example 12 | 3 | 4 | 5 | 6 | 7 | 1050 | 0.21 | 3.8 ×10$^{-7}$ | 48/52 | 80/20 | IV |
| Example 13 | 14 | 2 | 1 | | | 1050 | 0.21 | 3.4 ×10$^{-7}$ | 45/55 | 40/60 | III |
| Example 14 | 15 | 2 | 1 | | | 1050 | 0.21 | 3.3 ×10$^{-7}$ | 50/50 | 40/60 | III |
| Example 15 | 5 | 4 | 3 | | | 1050 | 0.32 | 5.8 ×10$^{-7}$ | 60/40 | 48/52 | III |
| Example 16 | 1 | 3 | 4 | | | 1050 | 0.27 | 6.9 ×10$^{-7}$ | 40/60 | 55/45 | IV |
| Example 17 | 4 | 3 | 1 | | | 1050 | 0.22 | 4.5 ×10$^{-7}$ | 55/45 | 40/60 | III |
| Comparative Example 1 | | | 3 | | | 1050 | 0.20 | 1.4 ×10$^{-6}$ | | | |
| Comparative Example 2 | | | 8 | | | 1070 | 0.23 | 7.7 ×10$^{-7}$ | | | |
| Comparative Example 3 | | | 11 | | | 1070 | 0.22 | 7.5 ×10$^{-7}$ | | | |

Example 15

The piezoelectric element was prepared under the same conditions as in the foregoing Example 1. In this process, application of paste 5, paste 4, and paste 3 was conducted in this order starting from the lower electrode side so that the layers may be respectively 3 $\mu$m, 3 $\mu$m, and 14 $\mu$m in thickness from the lower electrode side after burning and that the whole piezoelectric film may be 20 $\mu$m in thickness. Face analysis was conducted on the surface of the upper electrode side of the obtained piezoelectric film by EDX, and the Ti/Zr ratio was confirmed. The piezoelectric film was exfoliated from the lower electrode face, and face analysis was conducted on the surface of the lower electrode side of the piezoelectric film by EDX, and the Ti/Zr ratio was confirmed. Line analysis was conducted from the upper electrode side to the lower electrode side by EPMA. Then, change in Ti/Zr ratio in the direction of thickness of the piezoelectric film was confirmed.

The amplitude of the element at the time of applying an electric field of 40V was measured, and I–V characteristic was measured in order to evaluate leakage characteristic of the piezoelectric element at the time of applying an electric field of 40V. The composition of pastes, burning temperature, results of evaluation, each Ti/Zr ratio on the lower electrode side and the upper electrode side, and type of increase and decrease in Ti/Zr ratio (See FIG. 3) in this process, are shown in Table 1.

Example 16

The piezoelectric element was prepared under the same conditions as in the foregoing Example 1. In this process, application of paste 1, paste 3, and paste 4 was conducted in this order from the lower electrode side so that the layers may be respectively 2 $\mu$m, 6 $\mu$m, and 2 $\mu$m in thickness from the lower electrode side after burning and that the whole piezoelectric film may be 10 $\mu$m in thickness. Face analysis was conducted on the surface of the upper electrode side of the obtained piezoelectric film by EDX, and the Ti/Zr ratio was confirmed. The piezoelectric film was exfoliated from the lower electrode face, and face analysis was conducted on the surface of the lower electrode side of the piezoelectric film by EDX, and the Ti/Zr ratio was confirmed. Line analysis was conducted from the upper electrode side to the lower electrode side by EPMA. Then, change in Ti/Zr ratio in the direction of thickness of the piezoelectric film was confirmed.

The amplitude of the element at the time of applying an electric field of 40V was measured, and I–V characteristic was measured in order to evaluate leakage characteristic of the piezoelectric element at the time of applying an electric field of 40V. The paste composition, burning temperature, evaluation results, each Ti/Zr ratio on the lower electrode side and the upper electrode side, and type of increase and decrease in Ti/Zr ratio (See FIG. 3) in this process are also shown in Table 1.

Example 17

The piezoelectric element was made under the same conditions with the foregoing Example 1. Application of paste 4, paste 3, and paste 1 was conducted in this order from the lower electrode side so that the layers may be respectively 2 $\mu$m, 6 $\mu$m, and 2 $\mu$m in thickness from the lower electrode side after burning and that the whole piezoelectric film may be 10 $\mu$m in thickness. Face analysis was conducted on the surface of the upper electrode side of the obtained piezoelectric film by EDX, and the Ti/Zr ratio was confirmed. The piezoelectric film was exfoliated from the lower electrode face, and face analysis was conducted on the surface of the lower electrode side of the piezoelectric film by EDX, and the Ti/Zr ratio was confirmed. Line analysis was conducted from the upper electrode side to the lower electrode side by EPMA. Then, change in Ti/Zr ratio in the direction of thickness of the piezoelectric film was confirmed.

The amplitude of the element at the time of applying an electric field of 40V was measured, and I–V characteristic was measured in order to evaluate leakage characteristic of the piezoelectric element at the time of applying an electric field of 40V. The paste composition, burning temperature, evaluation results, each Ti/Zr ratio on the lower electrode side and the upper electrode side, and type of increase and decrease in Ti/Zr ratio (See FIG. 3) in this process are also shown in Table 1.

Comparative Examples 1 to 3

Figure 7:
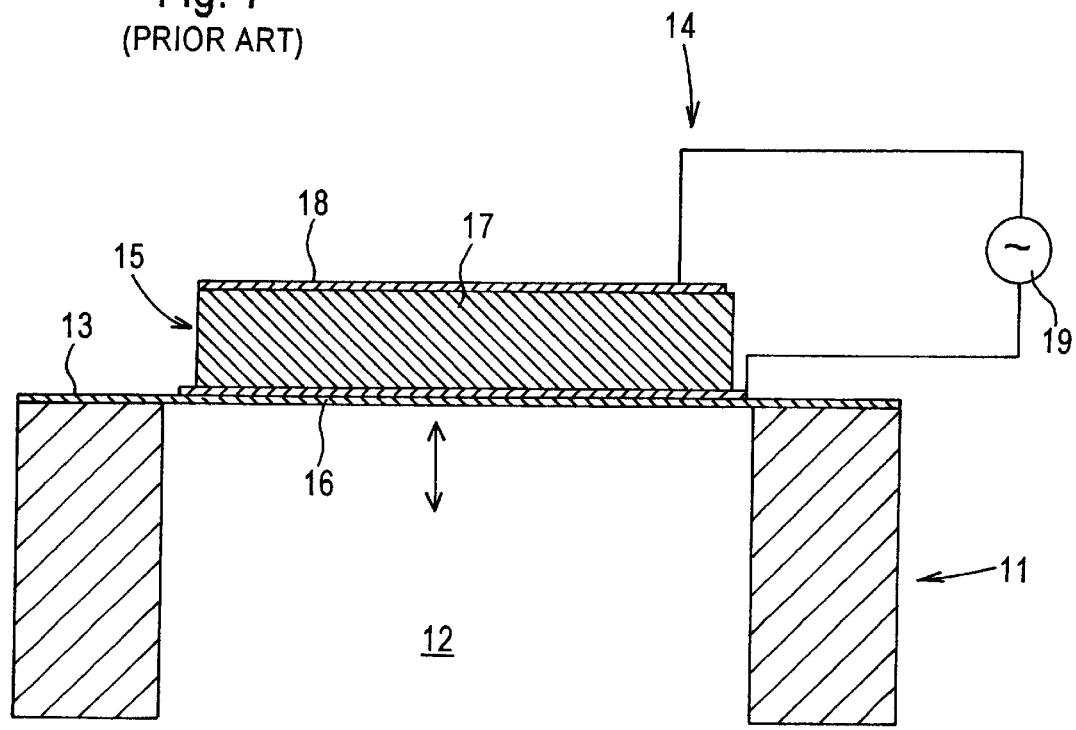
FIG. 7 is a vertical sectional view of an ink-jet printer head in which a conventional piezoelectric element is used as an actuator, and a part of the head is enlarged and schematically shown.

Piezoelectric elements composed as shown in FIG. 7 were prepared using only paste 3, only paste 8, and only paste 11 respectively by the same method as in the foregoing Example 1. For each of the obtained piezoelectric elements, the amplitude of the element at the time of applying an electric field of 30V was measured, and I–V characteristic was measured in order to evaluate leakage characteristic of the element at the time of applying an electric field of 30V. The paste composition, burning temperature, and evaluation results in this process are also shown in Table 1. I–V characteristics of the piezoelectric element obtained in Comparative Example 3 are indicated by the broken Line (a) in FIG. 5.

In each piezoelectric element of Examples 1 to 6, in which composition of the PZT thin film on the upper electrode side of the piezoelectric film is Ti/Zr=48/52, amplitude is approximately 0.3 $\mu$m at the time of applying a voltage of 30V. The amplitude is larger as compared with Comparative Examples 1 to 3, and advantage of the element constitution was confirmed. On the other hand, in each piezoelectric element of Examples 9 to 12, in which composition of the PZT thin film on the lower electrode side is Ti/Zr=48/52, the amplitude is approximately 0.2 $\mu$m. The amplitude is almost the same as the comparative examples, but leakage current at the time of applying a voltage of 30V is decreased to be approximately half of that in the comparative examples. This proves that I–V characteristics are improved.

(Preparation of Piezoelectric Solution)

Dehydrated lead acetate, lanthanum acetate, pentaethoxyniobium, tetra-i-propoxytitanium, and tetra-n-butoxy-zirconium were used as the starting materials of the respective composing elements.

Each starting material was added to 2-methoxyethanol and heated at a temperature of 120° C. for 6 hours in order to obtain the same composition as the foregoing paste. A brown homogeneous solution was thus obtained. 0.1M hydrochloric acid diluted with 2-methoxyethanol was dropped into the obtained solution. The amount of the added water was equal to the molar amount of alkoxide to be used. 2-methoxyethanol solution of hydroxypropyl cellulose (HPC-L) was added as viscosity improver to the solution. The amount of the added hydroxypropyl cellulose was 10% of the PZT precursor. The solution was prepared so that the oxide concentration may be 20 weight percent.

The composition of each solution is the same as that of the foregoing Pastes 1 to 13, and the solutions whose compositions respectively correspond to Pastes 1 to 13 are indicated by Liquids 1 to 13 respectively.

Examples 18 to 27

To prepare the piezoelectric element for an ink-jet printer head constructed as shown in FIG. 1, a Ti film of 50 nm in thickness and a Pt film of 0.5 $\mu$m in thickness to serve as the lower electrode were formed by sputtering method on a zirconia substrate of 5 $\mu$m in thickness to serve as a diaphragm. After a film was formed by applying the solution onto the lower electrode by spin coating method (1,200 r.p.m. for 30 seconds), the film was dried at a temperature of 120° C., then was temporarily burnt at a temperature of 400° C. (speed of temperature rise: 20° C./minute, kept for 15 minutes). These processes were repeated using each solution until the whole film thickness became 5 $\mu$m, and the obtained multilayer film was burnt at a temperature of 900° C. (speed of temperature rise: 10° C./minute, kept for 15minutes). The film formation using the solution of each composition was conducted in the same number of times. Face analysis was conducted on the surface of the upper electrode side of the obtained piezoelectric film by EDX, and the Ti/Zr ratio was confirmed. The piezoelectric film was exfoliated from the lower electrode face, and face analysis was conducted on the surface of the lower electrode side of the piezoelectric film by EDX, and the Ti/Zr ratio was confirmed. Line analysis was conducted from the upper electrode side to the lower electrode side by EPMA. Then, change in Ti/Zr ratio in the direction of thickness of the piezoelectric film was confirmed. Patterning was conducted on the obtained piezoelectric film using a photoresist, chemical etching was conducted, and the piezoelectric film was patterned to be 200 $\mu$m×3 mm in size. An Au film to serve as the upper electrode was formed on the obtained piezoelectric film by sputtering method, and thus a piezoelectric element was prepared.

Figure 6:
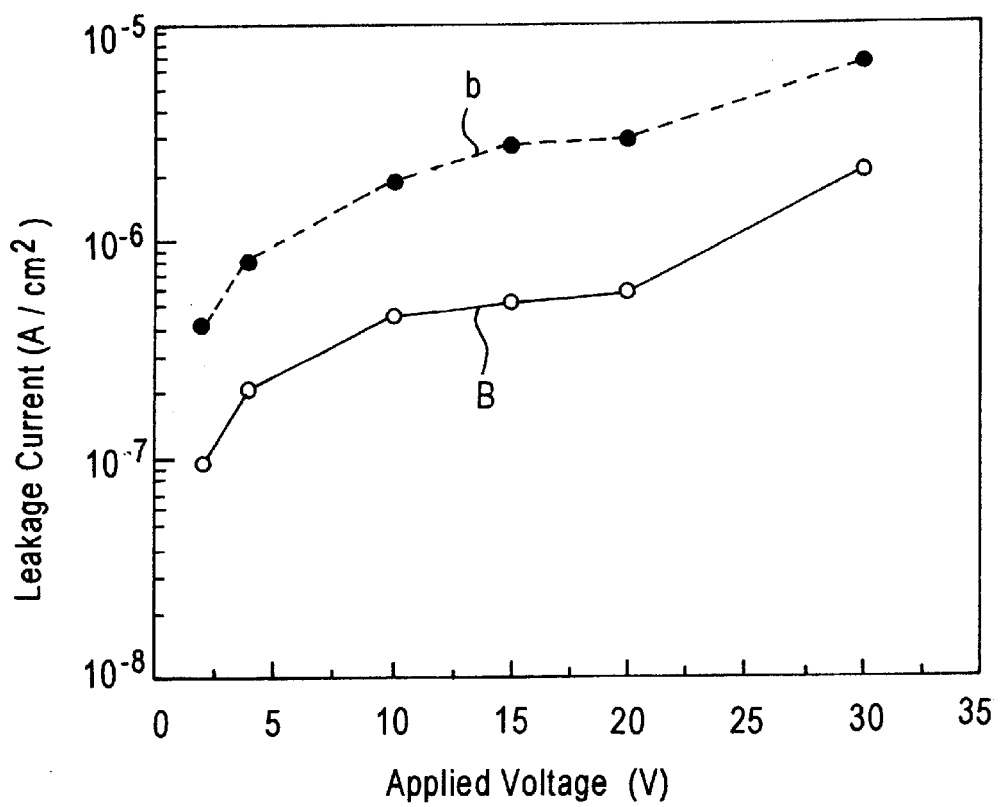
FIG. 6 is a diagram showing I–V characteristics of each of the piezoelectric elements obtained in Example 24 and each of the piezoelectric elements obtained in Comparative Example 4.

The obtained piezoelectric element was evaluated by measuring the amplitude of the element at the time of applying an electric field of 15V using a Tencor measuring instrument. I–V characteristics were measured in order to evaluate leakage characteristic of the piezoelectric element at the time of applying an electric field of 15 V. The composition of solutions, results of evaluation, each Ti/Zr ratio on the lower electrode side and the upper electrode side, and type of increase and decrease in Ti/Zr ratio (See FIG. 3) are collectively shown in Table 2. I–V characteristics of the piezoelectric element obtained in the foregoing Example 24 are indicated by the solid line B in FIG. 6.

TABLE 2

| | Liquid Composition (From Lower Electrode Side) | | | | | Amplitude ($\mu$m) | Leakage Current (A/Cm$^2$) | Th/Zr Ratio on Lower Electrode Side | Ti/Zr Ratio on Upper Electrode Side | Type of Increase/ Decrease |
|---|---|---|---|---|---|---|---|---|---|---|
| | 1$^{st}$ Layer | 2$^{nd}$ Layer | 3$^{rd}$ Layer | 4$^{th}$ Layer | 5$^{th}$ Layer | | | | | |
| Example 18 | 1 | 2 | 3 | | | 0.20 | 9.1 × 10$^{-7}$ | 40/60 | 48/52 | IV |
| Example 19 | 5 | 4 | 3 | | | 0.21 | 8.4 × 10$^{-7}$ | 60/40 | 48/52 | III |
| Example 20 | 6 | 5 | 4 | 3 | | 0.20 | 8.2 × 10$^{-7}$ | 70/30 | 48/52 | III |
| Example 21 | 7 | 6 | 5 | 4 | 3 | 0.20 | 8.1 × 10$^{-7}$ | 80/20 | 48/52 | III |
| Example 22 | 10 | 9 | 8 | | | 0.23 | 7.1 × 10$^{-7}$ | 60/40 | 48/52 | III |

TABLE 2-continued

| | Liquid Composition (From Lower Electrode Side) | | | | | Amplitude (μm) | Leakage Current (A/Cm²) | Th/Zr Ratio on Lower Electrode Side | Ti/Zr Ratio on Upper Electrode Side | Type of Increase/ Decrease |
|---|---|---|---|---|---|---|---|---|---|---|
| | 1st Layer | 2nd Layer | 3rd Layer | 4th Layer | 5th Layer | | | | | |
| Example 23 | 13 | 12 | 11 | | | 0.24 | $6.9 \times 10^{-7}$ | 60/40 | 48/52 | III |
| Example 24 | 3 | 2 | 1 | | | 0.18 | $5.5 \times 10^{-7}$ | 48/52 | 40/60 | III |
| Example 25 | 3 | 4 | 5 | | | 0.17 | $5.8 \times 10^{-7}$ | 48/52 | 60/40 | IV |
| Example 26 | 3 | 4 | 5 | 6 | | 0.18 | $5.2 \times 10^{-7}$ | 48/52 | 70/30 | IV |
| Example 27 | 3 | 4 | 5 | 6 | 7 | 0.18 | $5.1 \times 10^{-7}$ | 48/52 | 80/20 | IV |
| Example 28 | | | | | | 0.18 | $5.6 \times 10^{-7}$ | 60/40 | 48/52 | I |
| Example 29 | | | | | | 0.20 | $9.0 \times 10^{-7}$ | 48/52 | 40/60 | II |
| Comparative Example 4 | | | 3 | | | 0.15 | $2.8 \times 10^{-6}$ | | | |
| Comparative Example 5 | | | 8 | | | 0.16 | $1.0 \times 10^{-7}$ | | | |
| Comparative Example 6 | | | 10 | | | 0.18 | $9.7 \times 10^{-7}$ | | | |

Comparative Examples 4 to 6

Piezoelectric elements composed as shown in FIG. 7 were made using only Liquid 3, only Liquid 8, and only Liquid 10 respectively by the same method as in the foregoing Example 1 by burning at a temperature of 900° C. after repeating film formation, drying, and preliminarily burning until the film became 5 μm in thickness. For each of the obtained piezoelectric elements, amplitude of the element at the time of applying an electric field of 15V and I–V characteristics were measured. The composition of solution and results of evaluation in this process are shown in Table 2. I–V characteristics of the piezoelectric element obtained in Comparative Example 4 are indicated by the broken line (b) in FIG. 6.

Example 28

In the same manner as in the foregoing Example 18, a PZT film was formed on the Pt lower electrode formed on the substrate using Pb(DPM)$_2$, tetra-t-butoxyzirconium, and tetra-i-propoxytitanium as the starting materials by MOCDV method under the conditions of 2.2 torr in oxygen partial pressure and 600° C. in substrate temperature. In the film formation, flow rate of each raw material was adjusted so as to be Ti/Zr=60/40 in the initial composition. The flow rate of the Ti raw material and Zr raw material were respectively changed with the passage of time so that the Ti/Zr ratio may be 48/52 when the film thickness is 2 μm. After that, the film formation was conducted until the film thickness became 5 μm finally. After forming the film, the PZT film was burnt again at a temperature of 900° C., thus a piezoelectric film was formed. Face analysis was conducted on the surface of the upper electrode side of the obtained piezoelectric film by EDX, and the Ti/Zr ratio was confirmed. The piezoelectric film was exfoliated from the lower electrode face, and face analysis was conducted on the surface of the lower electrode side of the piezoelectric film by EDX, and the Ti/Zr ratio was confirmed. Line analysis was conducted from the upper electrode side to the lower electrode side by EPMA. Then, change in Ti/Zr ratio in the direction of thickness of the piezoelectric film was confirmed. An Au film to serve as the upper electrode was formed on the piezoelectric film by sputtering method, and thus a piezoelectric element was prepared.

Figure 2:
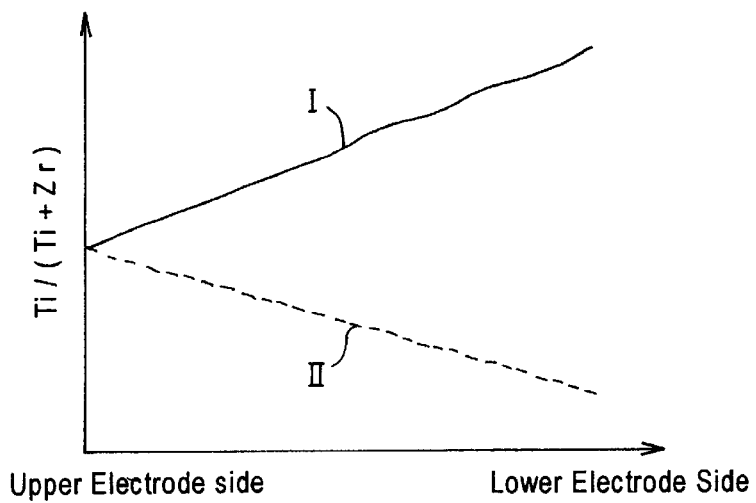
FIG. 2 is a diagram showing an Example that "concentration ratio of titanium to zirconium in the piezoelectric film is gradually increased or gradually decreased from the upper electrode side to the lower electrode side".

The obtained piezoelectric element was evaluated by measuring amplitude of the element at the time of applying an electric field of 15V using a Tencor measuring instrument. I–V characteristics were measured in order to evaluate leakage characteristic of the piezoelectric element at the time of applying an electric field of 15V. The evaluation results, each Ti/Zr ratio on the lower electrode side and the upper electrode side, and type of increase and decrease in Ti/Zr ratio (See FIG. 2) are also shown in Table 2.

Example 29

In the same as in the foregoing Example 28, flow rate of each raw material was adjusted so as to be Ti/Zr=48/52 in the initial composition. The flow rate of the Ti raw material and Zr raw material were respectively changed with the passage of time so that the Ti/Zr ratio may be 40/60 when the film thickness is 3 μm. After that, film formation was conducted until the film thickness became 5 μm finally. After forming the film, the PZT film was burnt again at a temperature of 900° C., and a piezoelectric film was formed. Face analysis was conducted on the surface of the upper electrode side of the obtained piezoelectric film by EDX, and the Ti/Zr ratio was confirmed. The piezoelectric film was exfoliated from the lower electrode face, and face analysis was conducted on the surface of the lower electrode side of the piezoelectric film by EDX, and the Ti/Zr ratio was confirmed. Line analysis was conducted from the upper electrode side to the lower electrode side by EPMA, and change in Ti/Zr ratio in the direction of thickness of the piezoelectric film was confirmed. The upper electrode was formed on the piezoelectric film in the same manner as in the foregoing Example 18, and thus a piezoelectric element was prepared.

The obtained piezoelectric element was evaluated by measuring amplitude of the element at the time of applying an electric field of 15V using a Tencor measuring instrument. I–V characteristics were measured in order to evaluate leakage characteristic of the piezoelectric element at the time of applying an electric field of 15V. The results of evaluation, each Ti/Zr ratio on the lower electrode side and the upper electrode side, and type of increase and decrease in Ti/Zr ratio (See FIG. 2) are also shown in Table 2.

The foregoing results prove that the same advantage is obtained also in the piezoelectric elements prepared using a solution in Examples 18 to 27 and the piezoelectric elements prepared by CVD method in Examples 28 and 29 as well as in the foregoing piezoelectric elements prepared using a paste.

When manufacturing ink-jet printer heads respectively using the piezoelectric elements obtained in the foregoing Example 9 and Example 24, ink jetting was confirmed in both heads. When manufacturing ink-jet printer heads provided with a plurality of ink nozzles in the same manner, ink jetting was confirmed also in those heads. This proves that the piezoelectric element according to the invention is quite useful as ink-jet printer head.

What is claimed is:

1. A piezoelectric element comprising:

an upper electrode and a lower electrode arranged on two sides of a piezoelectric film so as to sandwich the piezoelectric film therebetween, the piezoelectric film being formed of a composite oxide expressed by a chemical formula, $Pb(Zr_{1-x}Ti_x)O_3$ ($0.3 \leq x \leq 0.9$) or formed of a material mainly composed of the composite oxide, wherein concentration ratio of titanium to zirconium is said piezoelectric film is gradually increased or gradually decreased from said upper electrode side to said lower electrode side.

2. The piezoelectric element according to claim 1, wherein a face of said piezoelectric film, said face being in contact with said upper electrode, is formed of a composite oxide expressed by a chemical formula, $Pb(Zr_{1-x}Ti_x)O_3$ ($0.45 \leq x \leq 0.50$) or formed of a material mainly composed of the composite oxide, and concentration ratio of titanium to zirconium is gradually increased or gradually decreased toward said lower electrode side.

3. The piezoelectric element according to claim 1, wherein a face of said piezoelectric film, saidface being in contact with said lower electrode, is formed of a composite oxide expressed by a chemical formula, $Pb(Zr_{1-x}Ti_x)O_3$ ($0.45 \leq x \leq 0.50$) or formed of a material mainly composed of the composite oxide, and concentration ratio of titanium to zirconium is gradually increased or gradually decreased toward said upper electrode side.

4. The piezoelectric element according to claim 1, wherein said piezoelectric film is 1 $\mu$m to 25 $\mu$m in thickness.

5. The piezoelectric element according to claim 4, wherein said piezoelectric film is 2 $\mu$m to 12 $\mu$m in thickness.

6. The piezoelectric element according to claim 1, wherein said piezoelectric film is made of plural layers of thin films of the composite oxide which are different in concentration ratio of titanium to zirconium.

7. The piezoelectric element according to claim 6, wherein said piezoelectric film is made of PZT thin films of not less than three layers which are different in concentration ratio of titanium to zirconium.

8. The piezoelectric element according to claim 7, wherein said piezoelectric film is made of PZT thin films of not less than four layers which are different in concentration ratio of titanium to zirconium.

9. A process for producing a piezoelectric element comprising the steps of:

forming a lower electrode on a substrate;

forming a piezoelectric film, which is composed of a composite oxide expressed by a chemical formula, $Pb(Zr_{1-x}Ti_x)O_3$ ($0.3 \leq x \leq 0.9$) or formed of a material mainly composed of the composite oxide, on said lower electrode; and forming an upper electrode on said piezoelectric film;

wherein said piezoelectric film is formed by using plural types of compositions which respectively contain said composite oxide and/or a precursor of said composite oxide and are different in concentration ratio of titanium to zirconium, and laminating the compositions on said lower electrode in order of concentration ratio of titanium to zirconium that gradually increases or gradually decreases.

10. The process for producing a piezoelectric element according to claim 9, wherein not less than three types of compositions which are different in concentration ratio of titanium to zirconium are used.

11. The process for producing a piezoelectric element according to claim 10, wherein not less than four types of compositions which are different in concentration ratio of titanium to zirconium are used.

12. The process for producing a piezoelectric element according to claim 9, wherein said compositions are pastes.

13. The process for producing a piezoelectric element according to claim 9, wherein said compositions are solutions.

14. The process for producing a piezoelectric element according to claim 13, wherein said solutions are prepared using metallic alkoxide and/or metallic salt as starting material.

15. A process for producing a piezoelectric element comprising the steps of:

forming a lower electrode on a substrate, forming a piezoelectric film, which is composed of a composite oxide expressed by a chemical formula, $Pb(Zr_{1-x}Ti_x)O_3$ ($0.3 \leq x \leq 0.9$) or formed of a material mainly composed of the composite oxide, on said lower electrode; and forming an upper electrode on said piezoelectric film;

wherein the piezoelectric film is formed on said lower electrode by vacuum method such as sputtering method, vacuum deposition method, CVD method, and laser ablation method so that concentration ratio of titanium to zirconium in said piezoelectric film may gradually increase or gradually decrease from said upper electrode side to said lower electrode side.

16. An ink-jet printer head in which one or not less than two ink nozzles are provided, capacity of an ink chamber communicating to the ink nozzle is changed by an actuator, and ink is jetted through the ink nozzle, wherein the piezoelectric element according to claim 1 is used as said actuator.

* * * * *